(12) United States Patent
Akiyoshi et al.

(10) Patent No.: US 11,408,910 B2
(45) Date of Patent: Aug. 9, 2022

(54) ACCELERATOR POSITION DETECTION DEVICE WITH IMPROVED ABNORMAL DETECTION

(71) Applicant: HONDA MOTOR CO., LTD., Tokyo (JP)

(72) Inventors: Hiroyuki Akiyoshi, Wako (JP); Yutaka Sonoda, Wako (JP); Takashi Tetsuka, Wako (JP); Yutaka Kikuchi, Wako (JP); Takuya Osanai, Wako (JP); Shinji Misawa, Wako (JP); Kazuhiko Ono, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 468 days.

(21) Appl. No.: 16/495,563

(22) PCT Filed: Mar. 24, 2017

(86) PCT No.: PCT/JP2017/012008
§ 371 (c)(1),
(2) Date: Sep. 19, 2019

(87) PCT Pub. No.: WO2018/173254
PCT Pub. Date: Sep. 27, 2018

(65) Prior Publication Data
US 2020/0110113 A1  Apr. 9, 2020

(51) Int. Cl.
*G01P 15/03* (2006.01)
*G01P 1/02* (2006.01)
(Continued)

(52) U.S. Cl.
CPC ............ *G01P 15/034* (2013.01); *G01P 1/023* (2013.01); *G01D 5/145* (2013.01); *G01R 33/07* (2013.01)

(58) Field of Classification Search
None
See application file for complete search history.

(56) References Cited

U.S. PATENT DOCUMENTS

| 2001/0004213 A1* | 6/2001 | Kubota | ................ F02D 11/107 |
|---|---|---|---|
| | | | 324/528 |
| 2013/0214767 A1* | 8/2013 | Shintani | ................... G01B 7/30 |
| | | | 324/207.25 |

(Continued)

FOREIGN PATENT DOCUMENTS

| CN | 102706370 A | 10/2012 |
|---|---|---|
| CN | 103620192 A | 3/2014 |

(Continued)

OTHER PUBLICATIONS

Chinese Office Action and Search Report for Chinese Application No. 201780088653.1, dated Jul. 2, 2021, with English translation of the Office Action.

(Continued)

*Primary Examiner* — Lisa M Caputo
*Assistant Examiner* — Nigel H Plumb
(74) *Attorney, Agent, or Firm* — Birch, Stewart, Kolasch & Birch, LLP

(57) ABSTRACT

An accelerator position detection device includes a handlebar grip that is turnable in a normal rotation direction and in a reverse rotation direction from a neutral position and is energized to the neutral position when no operation is applied; accelerator position sensors that output voltage according to an angle of the handlebar grip and that include a first sensor and a second sensor; and a detector that detects an angle for control for controlling a vehicle on the basis of the angle of the handlebar grip according to output from the accelerator position sensors. The detector detects an angle as a positive value on the basis of a first voltage when the first voltage in a rising range is output, and the detector detects (Continued)

an angle as a negative value on the basis of a second voltage when a first initial value not located in the rising range is output.

9 Claims, 8 Drawing Sheets

(51) Int. Cl.
*G01D 5/14* (2006.01)
*G01R 33/07* (2006.01)

(56) References Cited

U.S. PATENT DOCUMENTS

| | | | |
|---|---|---|---|
| 2014/0083394 A1* | 3/2014 | Watanabe | G01B 7/30 123/399 |
| 2014/0103916 A1 | 4/2014 | Nomura et al. | |
| 2014/0103918 A1* | 4/2014 | Nomura | G01R 19/0092 324/244 |
| 2014/0145713 A1* | 5/2014 | Watanabe | B60K 26/02 324/207.25 |
| 2017/0057354 A1* | 3/2017 | Nishihara | B60W 30/18172 |

FOREIGN PATENT DOCUMENTS

| | | |
|---|---|---|
| CN | 103660936 A | 3/2014 |
| DE | 19702788 A1 | 7/1998 |
| DE | 102013224115 A1 | 5/2014 |
| EP | 1111343 A1 | 6/2001 |
| EP | 1134113 A2 | 9/2001 |
| EP | 2505472 A2 | 10/2012 |
| JP | 11-151948 A | 6/1999 |
| JP | 2004-314929 A | 11/2004 |
| JP | 2009-13833 A | 1/2009 |
| JP | 2014-80180 A | 5/2014 |
| JP | 2015-81564 A | 4/2015 |

OTHER PUBLICATIONS

Extended European Search Report, dated Mar. 3, 2020, for European Application No. 17901969.0.
International Search Report (PCT/ISA/210) issued in PCT/JP2017/012008, dated Jun. 20, 2017.
International Preliminary Report on Patentability and Written Opinion of the International Searching Authority dated Oct. 3, 2019, for International Application No. PCT/JP2017/012008, with an English Transation.
Japanese Office Action, dated Jul. 1, 2020, for Japanese Application No. 2019-506887, with an English translation.

* cited by examiner

ACCELERATOR POSITION DETECTION DEVICE WITH IMPROVED ABNORMAL DETECTION

TECHNICAL FIELD

The present invention relates to an accelerator position detection device that realizes a handlebar grip turnable in not only a positive direction but a negative direction from a neutral position.

BACKGROUND ART

In an accelerator position detection device disclosed in a patent literature 1, output voltage related to an accelerator position (a turning angle) increases according to an accelerator position in one sensor and decreases according to an accelerator position in the other sensor respectively by arranging each accelerator position sensor on a surface and the back of a board. FIG. 9 in the patent literature 1 shows that voltage output that increases in the one sensor and decreases in the other sensor mutually cross and magnitude relation of voltage interchanges.

CITATION LIST

Patent Literature

Patent Literature 1: JP-A 2004-314929

SUMMARY OF INVENTION

Technical Problem

In the above-mentioned accelerator position detection device according to the related art, output voltage features and the other settings of the accelerator position sensors are made supposing a case that a handlebar grip can be turned only in one direction (shall be a positive direction) from its fully closed position (shall be 0°). In this case, it is conceivable that separate control operation from the case of turning in the positive direction can be further realized in addition by enabling also turning the handlebar grip in a reverse direction (that is, in a negative direction) from the fully closed position being 0°.

However, the accelerator position detection device according to the related art cannot necessarily handle the following problems in a case that the handlebar grip can be turned in both directions from the fully closed position being 0°.

That is, in the accelerator position detection device according to the related art, the handlebar grip is turned only on the front side (in the positive direction) and as the accelerator position is set to be only 0° or more, the fully closed position as a grip angle has only to be set as 0°. In the meantime, when operation for pushing the handlebar grip (turning operation in the negative direction) is added, the fully closed position of the accelerator position becomes minus, and a stopper and an energizing member are required to be used to return the handlebar grip to a position of 0° as a neutral position when an occupant applies no force to the handlebar grip. When the neutral position varies because of structure of the stopper and the energizing member, a problem that the accelerator position varies in no operated state occurs.

For example, though the two accelerator position sensors are provided in the patent literature 1, the sensors are provided only for failure detection and when the sensors are applied to a case that the handlebar grip is also turned in the negative direction, there is a problem that loads of ECU operation by correction processing for discriminating whether the accelerator position is neutral for dispersion of the neutral position or not increase and precise neutral is required to be provided.

Further, considering the application to the case that the handlebar grip is also turned in the negative direction, the failure detection in the negative direction of the sensors is also required to be handled. However, as shown in FIG. 9 in the patent literature 1 described above, when the output of the two accelerator position sensors is set to cross, magnitude relation of the two sensor output may be made reverse because of an error of output values in the crossing areas. Accordingly, when the failure detection of the sensors is made on the basis of the magnitude relation in the two sensor output, dispersion is caused in a failure detectable area according to the technique of the patent literature 1.

In view of the above-mentioned problems of the related art, a first object of the present invention is to provide an accelerator position detection device that enables readily discriminating a neutral state for dispersion of neutral positions in a handlebar grip turnable in not only a positive direction but in a negative direction from a neutral position.

Besides, a second object of the present invention is to provide the accelerator position detection device further including a more expanded failure detectable area than that in the related art.

Solution to Problem

The present invention has a first feature that an accelerator position detection device (100) comprises: a handlebar grip (2) that is turnable in a normal rotation direction and in a reverse rotation direction from a neutral position and that is energized to the neutral position when no operation is applied; accelerator position sensors (81, 82) that output voltage according to an angle of the handlebar grip (2) and that include a first sensor (81) and a second sensor (82); and a detector (91) that detects an angle for control for controlling a vehicle on the basis of the angle of the handlebar grip (2) according to output from the accelerator position sensors (81, 82), wherein the first sensor (81) outputs first voltage rising in volume from a position exceeding a first rise start angle (D1) located in a normal rotation direction by predetermined quantity from the neutral position in the normal rotation direction, and the second sensor (82) outputs second voltage rising in volume from a position exceeding a second rise start angle (D2) located in a reverse rotation direction from the neutral position by predetermined quantity in the normal rotation direction.

The present invention has a second feature that the first sensor (81) and the second sensor (82) are configured in such a manner that a first incline on which the first voltage rises and a second incline on which the second voltage rises are different.

The present invention has a third feature that the first sensor (81) and the second sensor (82) are configured to make the first incline on which the first voltage rises larger than the second incline on which the second voltage rises and to make a first initial value (V1) when the first voltage starts to rise larger than a second initial value (V2) when the second voltage starts to rise.

The present invention has a fourth feature that the first sensor (81) and the second sensor (82) are configured to constantly make the first voltage higher than the second voltage in a range in which the handlebar grip (2) is turned.

The present invention has a fifth feature that judgment that failure occurs in the first sensor (81) and/or the second sensor (82) is made when the first voltage is not higher than the second voltage in output.

The present invention has a sixth feature that the detector (91) detects an angle for control as a positive value on the basis of the first voltage when the first voltage in a rising range is output, and the detector (91) detects an angle for control as a negative value on the basis of the second voltage when a first initial value (V1) not located in the rising range is output.

The present invention has a seventh feature that the detector (91) detects an angle for control as the positive value as a value according to a rising amount of the first voltage when the first voltage in the rising range is output, and the accelerator position detection device further includes a controller (92) that executes first control according to the angle for control as the positive value.

The present invention has an eighth feature that the detector (91) detects an angle for control continuously increasing according to an increase of the first voltage and the second voltage as the positive value and the negative value by detecting an angle for control when the first voltage starts to rise as zero, the accelerator position detection device further includes a controller (92) that executes second control according to the angle for control as the negative value, and the controller (92) executes the second control using that an angle for control as the negative value increases in the normal rotation direction and exceeds a negative predetermined threshold for a trigger.

The present invention has a ninth feature that the second control means a release of auto-cruise control in a vehicle.

Advantageous Effects of Invention

According to the first feature of the present invention that an accelerator position detection device (100) comprises: a handlebar grip (2) that is turnable in a normal rotation direction and in a reverse rotation direction from a neutral position and that is energized to the neutral position when no operation is applied; accelerator position sensors (81, 82) that output voltage according to an angle of the handlebar grip (2) and that include a first sensor (81) and a second sensor (82); and a detector (91) that detects an angle for control for controlling a vehicle on the basis of the angle of the handlebar grip (2) according to output from the accelerator position sensors (81, 82), wherein the first sensor (81) outputs first voltage rising in volume from a position exceeding a first rise start angle (D1) located in a normal rotation direction by predetermined quantity from the neutral position in the normal rotation direction, and the second sensor (82) outputs second voltage rising in volume from a position exceeding a second rise start angle (D2) located in a reverse rotation direction from the neutral position by predetermined quantity in the normal rotation direction, as the neutral position can be readily detected by regarding the position where the first voltage rises as a neutral position without causing the increase of operation loads of ECU and others and requiring a precise neutral mechanism, the first object is achieved and the present invention can also cope with control when the handlebar grip is turned in the negative direction on the basis of the second voltage referable differently from the first voltage.

According to the second feature of the present invention that the first sensor (81) and the second sensor (82) are configured in such a manner that a first incline on which the first voltage rises and a second incline on which the second voltage rises are different, as the first incline of the first voltage and the second incline of the second voltage are different, the first sensor and the second sensor can be prevented from simultaneously failing by vibration applied by a vehicle.

According to the third feature of the present invention that the first sensor (81) and the second sensor (82) are configured to make the first incline on which the first voltage rises larger than the second incline on which the second voltage rises and to make a first initial value (V1) when the first voltage starts to rise larger than a second initial value (V2) when the second voltage starts to rise, magnitude relation between the first voltage and the second voltage can be clarified.

According to the fourth feature of the present invention that the first sensor (81) and the second sensor (82) are configured to constantly make the first voltage higher than the second voltage in a range in which the handlebar grip (2) is turnedThe first sensor and/or the second sensor can be configured by setting the first voltage to be constantly higher than the second voltage so the sensors can detect failure and the second object is achieved.

According to the fifth feature of the present invention that judgment that failure occurs in the first sensor (81) and/or the second sensor (82) is made when the first voltage is not higher than the second voltage in output,when the first voltage is not larger than the second voltage, it can be determined that failure occurs in the first sensor and/or the second sensor.

According to the sixth feature of the present invention that the detector (91) detects an angle for control as a positive value on the basis of the first voltage when the first voltage in a rising range is output, and the detector (91) detects an angle for control as a negative value on the basis of the second voltage when a first initial value (V1) not located in the rising range is output, as the first voltage and the second voltage are suitably switched and an angle for control is detected, a new function for control can be added to the technique using the first sensor and the second sensor respectively configured to only detect failure heretofore together. At this time, as a further additional sensor is not especially required, a cost can be inhibited.

According to the seventh feature of the present invention that the detector (91) detects an angle for control as the positive value as a value according to a rising amount of the first voltage when the first voltage in the rising range is output, and the accelerator position detection device further includes a controller (92) that executes first control according to the angle for control as the positive value, the first control according to a rise of the first voltage can be executed.

According to the eighth feature of the present invention that the detector (91) detects an angle for control continuously increasing according to an increase of the first voltage and the second voltage as the positive value and the negative value by detecting an angle for control when the first voltage starts to rise as zero, the accelerator position detection device further includes a controller (92) that executes second control according to the angle for control as the negative value, and the controller (92) executes the second control using that an angle for control as the negative value increases in the normal rotation direction and exceeds a negative predetermined threshold for a trigger, even if some displacement is caused in the neutral position, the second control can be securely made according to behavior of the second voltage when the occupant turns the handlebar grip in the reverse direction and especially, the second control is prevented from being executed in the neutral position by mistake.

According to the ninth feature of the present invention that the second control means a release of auto-cruise control in a vehicle, when the occupant turns the handlebar grip in the reverse direction, control for releasing auto-cruise control can be performed.

DESCRIPTION OF EMBODIMENTS

Figure 1:
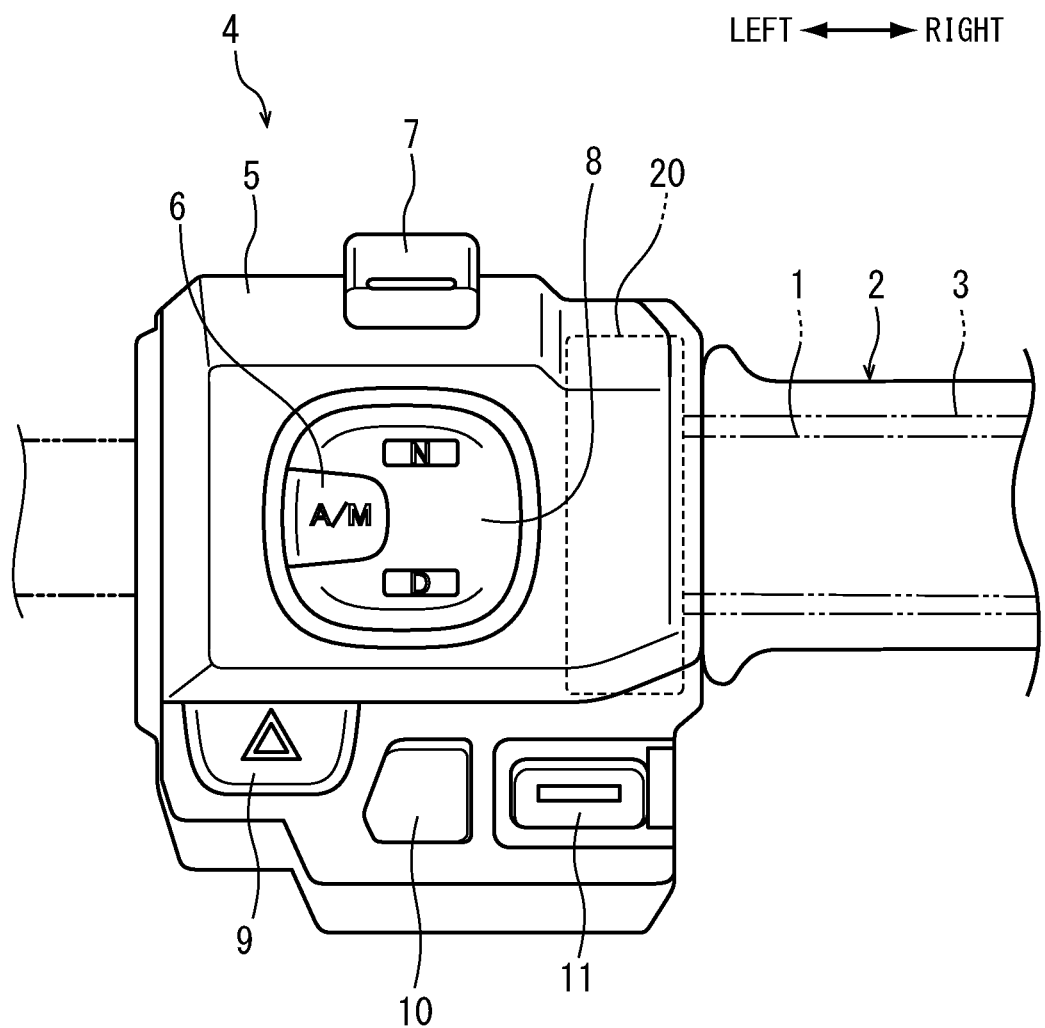
FIG. 1 is a front view showing a handlebar switch provided to a steering handlebar of a motorcycle which mounts an accelerator position detection device according to the present invention and to which the above-mentioned accelerator position detection device can be applied.

FIG. 1 is a front view showing a handlebar switch 4 provided to a steering handlebar 1 of a motorcycle which mounts an accelerator position detection device according to the present invention and to which the above-mentioned accelerator position detection device can be applied. In a housing 5 of the handlebar switch 4, there are arranged an engine stop switch 7, a drive-neutral (D-N) mode changeover switch 8 for switching an operation mode of a dual clutch transmission, an auto-manual (A/M) mode changeover switch 6 for automatically or manually switching shift operation when a D mode is selected, a hazard indicator switch 9, an idle stop control switch 10 and a starter switch 11.

In the housing 5, a throttle holder 20 of a handlebar grip 2 turnably journaled to a right end of the steering handlebar 1 is housed. The handlebar grip 2 is acquired by fixing a grip member such as rubber to the peripheral side of a throttle pipe 3 loosely fitted to the steering handlebar 1. An inner end in a vehicle width direction of the throttle pipe 3 is held inside the throttle holder 20.

Figure 2:
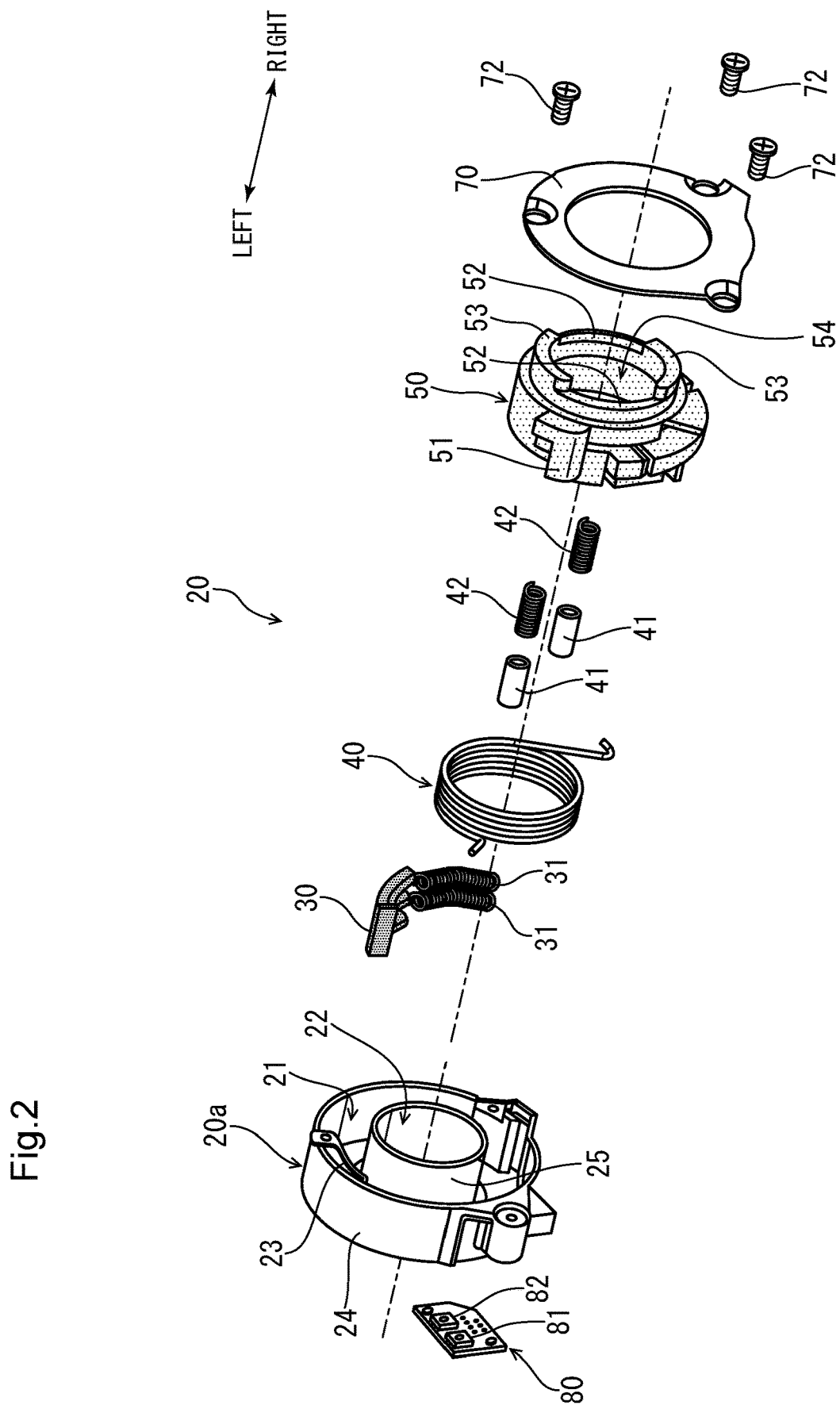
FIG. 2 is an exploded perspective view showing the throttle holder.

FIG. 2 is an exploded perspective view showing the throttle holder 20. A throttle angle sensor that detects a turning angle of the handlebar grip 2 is provided to the throttle holder 20. Besides, the throttle holder 20 can not only turn the handlebar grip 2 by a predetermined angle in a normal rotation direction from a neutral position but can turn it by a predetermined angle in a reverse rotation direction, and the handlebar grip is configured so that it is returned to the neutral position by energizing force by energizing means even if the handlebar grip is turned in either direction.

The throttle holder 20 is assembled by housing plural parts inside a housing 20a on the left side in the vehicle width direction and covering the parts with a lid 70 on the right side in the vehicle width direction. An annular bottomed recess 21 is formed between a crust 24 and an inner cylinder 25 respectively of the housing 20a. The steering handlebar 1 is inserted into an opening 22 of the inner cylinder 25. A board 80 mounting a first sensor 81 and a second sensor 82 that respectively function as an accelerator position sensor by being configured as linear hall IC is attached from the left side in the vehicle width direction of the housing 20a.

A guide plate 23 for holding a movable stopper 30 and a first return spring 31 are provided to the bottomed recess 21 of the housing 20a. The first return spring 31 generates energizing force for returning the handlebar grip 2 turned in the reverse rotation direction to the neutral position. A large-diameter second return spring 40 generates energizing force for returning the handlebar grip 2 turned in the normal rotation direction to the neutral position.

A left end in the vehicle width direction of the throttle pipe 3 is positioned in a rotation direction by being fitted to a pair of projections 53 and a pair of recesses 52 respectively formed outside an opening 54 of a sensor rotor 50. An abutting part 51 provided to a periphery of the sensor rotor 50 is configured to abut on a stopper (see FIG. 5) formed in the housing 20a and the movable stopper 30.

A bottomed cylindrical pressing member 41 into which an energizing member 42 is inserted is housed on the left side in the vehicle width direction of the sensor rotor 50. The pressing member 41 axially energized by the energizing member 42 in a state in which the lid 70 is fixed to the housing 20a by three screws 72 abuts on a frictional member inserted at a bottom of the bottomed recess 21 of the housing 20a. Hereby, suitable weight is generated for turning operation of the handlebar grip 2.

Figure 3:
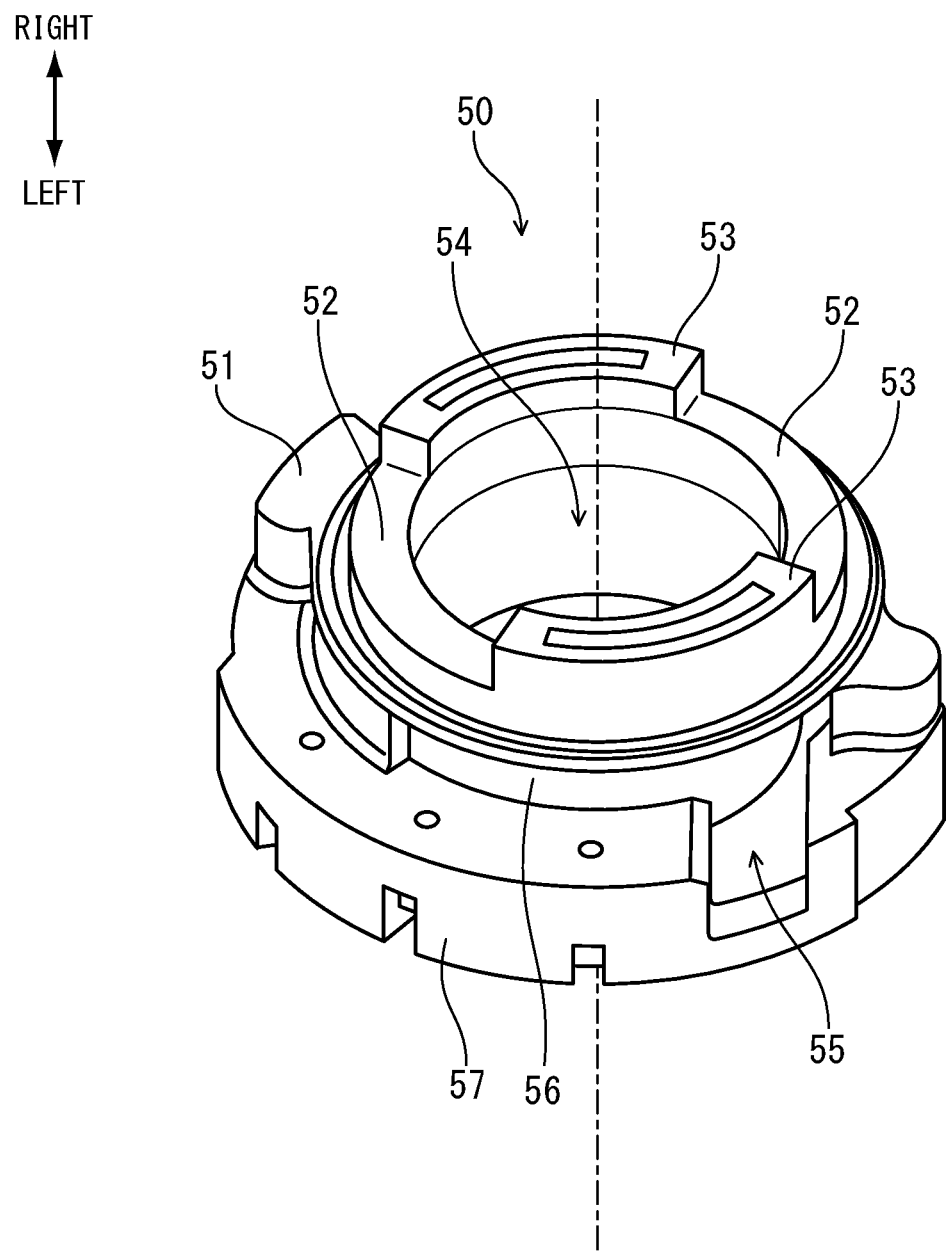
FIG. 3 is a perspective view showing the sensor rotor viewed from the outside in the vehicle width direction.
Figure 4:
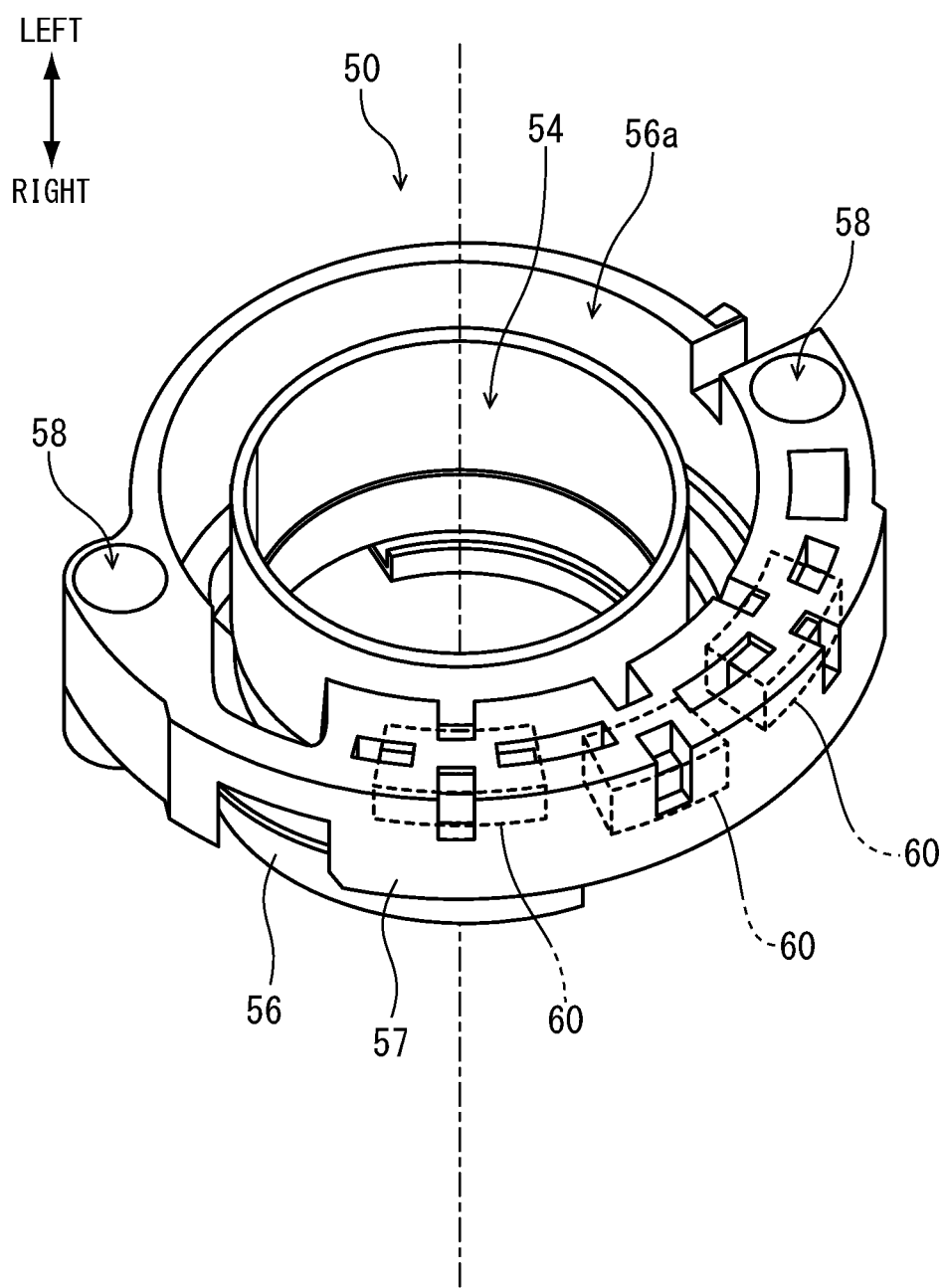
FIG. 4 is a perspective view showing the sensor rotor viewed from the inside in the vehicle width direction.

FIG. 3 is a perspective view showing the sensor rotor 50 viewed from the outside in the vehicle width direction. Besides, FIG. 4 is a perspective view showing the sensor rotor 50 viewed from the inside in the vehicle width direction. As described above, the pair of projections 53 and the pair of recesses 52 are formed at an end of a small-diameter part 56 of the sensor rotor 50 and the abutting part 51 is formed on a large-diameter part 57 of the sensor rotor 50. An opening 55 for passing wiring connected to the board 80 is formed between the small-diameter part 56 and the large-diameter part 57.

As shown in FIG. 4, an annular recess 56a for housing the second return spring 40 is formed inside the sensor rotor 50 in the vehicle width direction. Besides, a bottomed recess 58 for housing the energizing member 42 and the pressing member 41 is formed in the large-diameter part 57. Three permanent magnets 60 forming a magnetic field detected by the first sensor 81 and the second sensor 82 are arranged in Halbach array by insert-molding the permanent magnets into the large-diameter part 57.

Figure 5:
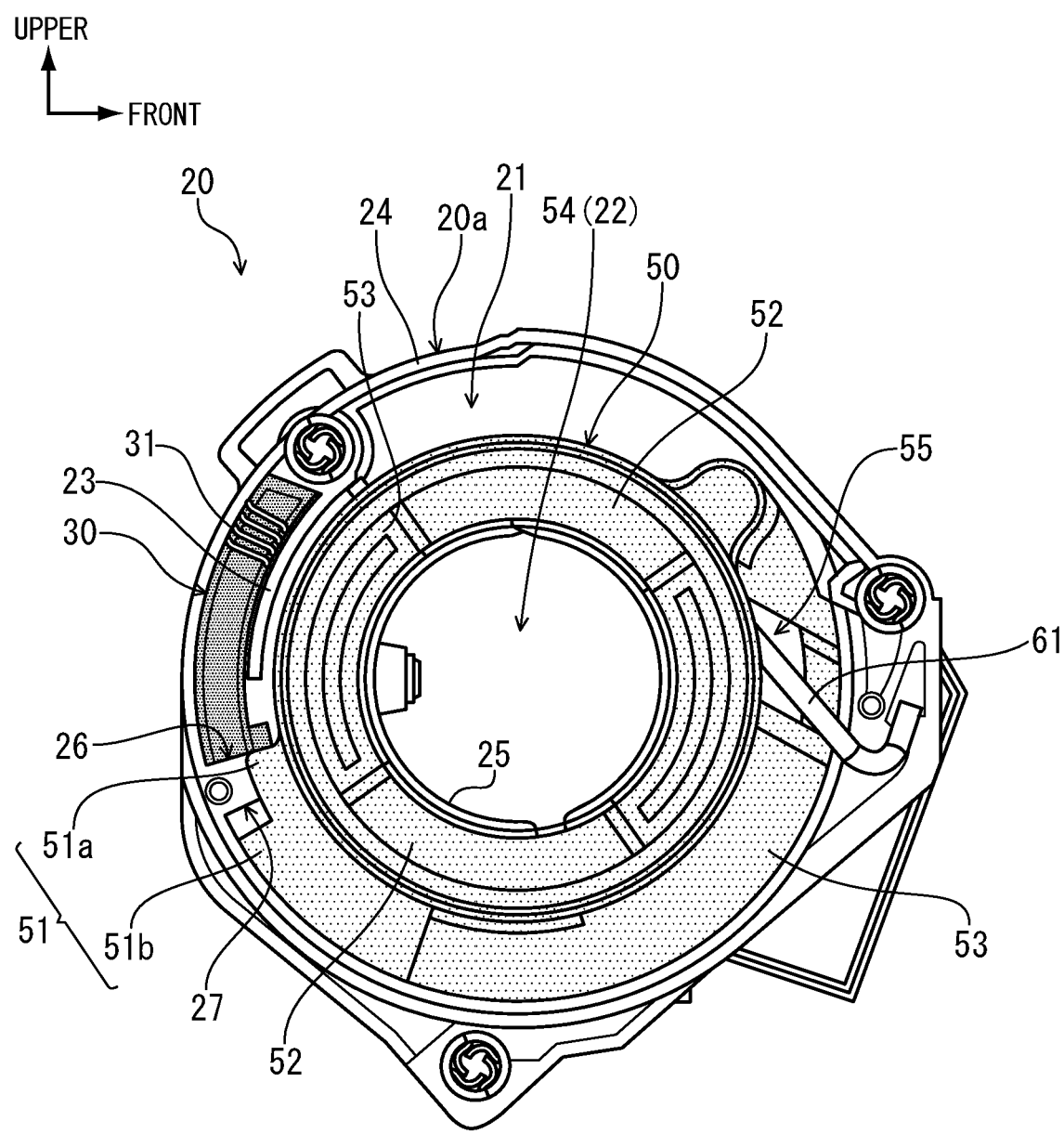
FIG. 5 is a right side view showing a state in which the lid is removed from the throttle holder.

FIG. 5 is a right side view showing a state in which the lid 70 is removed from the throttle holder 20. As described above, the throttle holder 20 is configured so that the handlebar grip 2 can be turned both in the normal rotation direction and in the reverse rotation direction. When no operating force is applied to the handlebar grip 2, the movable stopper 30 held on the guide plate 23 is energized by the first return spring 31 and is struck on a first stopper face 26 formed in the housing 20a.

At this time, a first abutting part 51a of the abutting part 51 formed in the sensor rotor 50 abuts on the movable stopper 30 by energizing force in the reverse rotation direction by the second return spring 40, however, as energizing force of the first return spring 31 is stronger, the handlebar grip 2 is held in a neutral position defined by the first stopper face 26.

In the meantime, when an occupant turns the handlebar grip 2 with operating force against energizing force of the first return spring 31 in the reverse rotation direction, the movable stopper 30 that abuts on the first abutting part 51a is moved in the reverse rotation direction. A limit position in the reverse rotation direction is defined by a second stopper face 27 formed in the housing 20a and a second abutting part 51b that is provided to the abutting part 51 and abuts on the second stopper face 27. When the operating force in the reverse rotation direction is released, the removable stopper is returned to the neutral position by energizing force of the first return spring 31 again. The wiring 61 connected to the board 80 is guided outside the housing 2a through the opening 55 of the sensor rotor 50.

According to the above-mentioned configuration of the throttle holder, throttle operation in the normal rotation direction is enabled with the similar operation feeling to a normal throttle device, and a throttle device that enables turning in the reverse rotation direction only when the occupant intentionally operates can be acquired.

However, in such a throttle holder, a stop position of the handlebar grip 2 when no operating force is applied may be slightly displaced from a neutral position in design because of dispersion of each part and hysteresis. Concretely, the stop position may be displaced in the reverse rotation direction because of relation between hysteresis of energizing force of the first return spring 31 and frictional force. Besides, when abutting parts of the movable stopper 30 and the first stopper face 26 are worn, the energizing force of the first return spring 31 is relatively deteriorated and the stop position may be displaced in the reverse rotation direction. Further, when the energizing force of the second return spring 40 is deteriorated, the stop position may be displaced in the normal rotation direction.

According to the accelerator position detection device described below according to the present invention, even if such displacement is caused, a neutral state can be readily discriminated without increasing an operation load of ECU and failure detection when sensor failure is caused is enabled in the whole area of a turnable normal rotation direction. Besides, even if sensor output itself in a neutral state varies because of a temperature feature and output hysteresis, errors can be absorbed.

Figure 6:
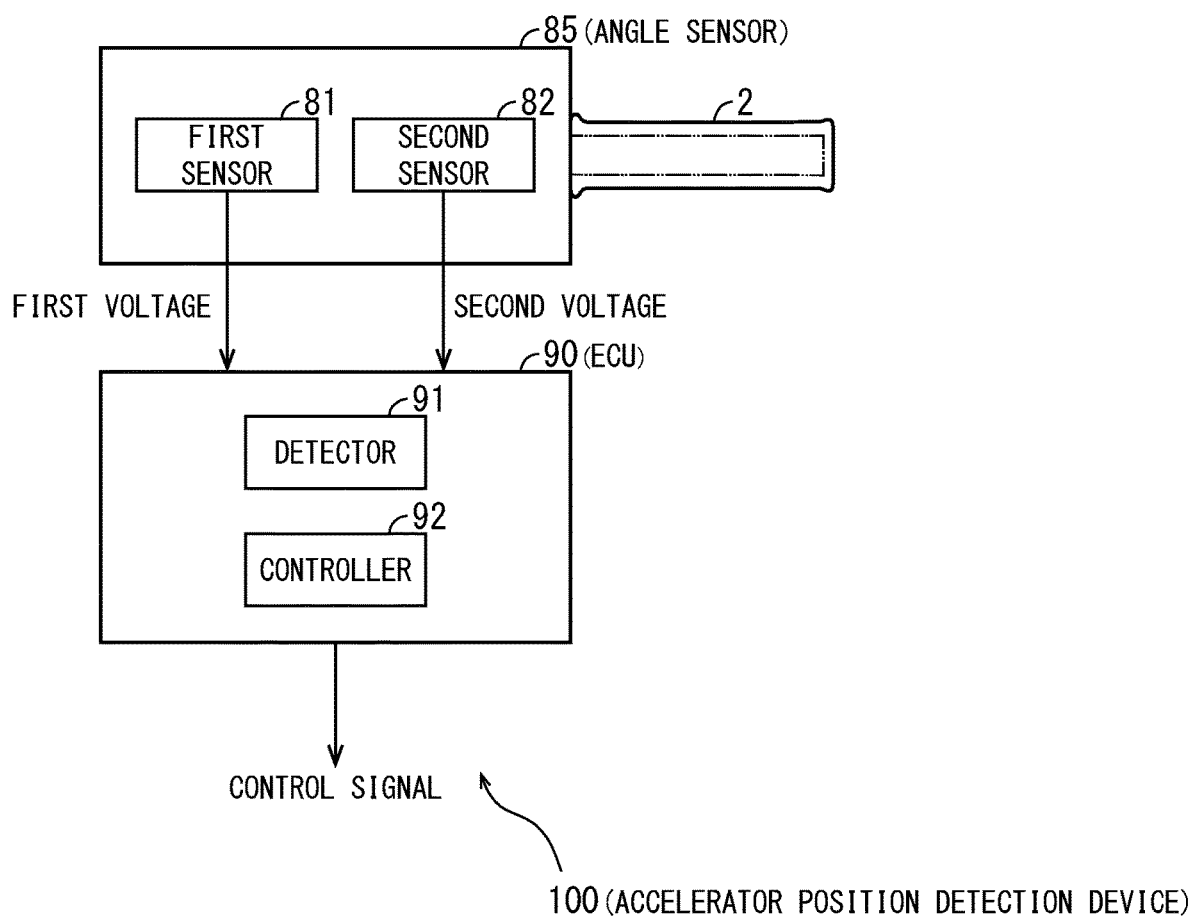
FIG. 6 is a functional block diagram showing an accelerator position detection device according to one embodiment.

FIG. 6 is a functional block diagram showing an accelerator position detection device according to one embodiment. As shown in FIG. 6, the accelerator position detection device 100 is provided with the handlebar grip 2 also shown in FIG. 1, an angle sensor 85 that outputs voltage according to an angle (a turning angle) as a manipulated variable by the handlebar grip 2 and an electronic control unit (ECU) 90 that detects an angle of the handlebar grip 2 on the basis of the voltage received from the angle sensor 85 and applies predetermined control processing and others according to the detected angle to the motorcycle.

As described above, the handlebar grip 2 is configured so that an angle can be advanced in a positive direction when the occupant operates toward one direction equivalent to the front side from a predetermined position corresponding to 0° and an angle can be also advanced in a negative direction when the occupant operates toward the other direction equivalent to the back from the predetermined position. Besides, as described above, when the occupant applies no operation to the handlebar grip 2, the handlebar grip is configured so that it is returned to the predetermined position corresponding to zero deg. by energizing force by energizing means.

The angle sensor 85 can be at least provided with the first sensor 81 and the second sensor 82 respectively also shown in FIG. 2. Output voltage features of the first sensor and the second sensor can be set so that voltage corresponding to magnetic flux density arising on Hall element according to an angle by the permanent magnets 60 (see FIG. 4) turned together with the handlebar grip 2 is output by configuring both the first sensor 81 and the second sensor 82 as a programmable (that is, settable) linear Hall IC.

Figure 7:
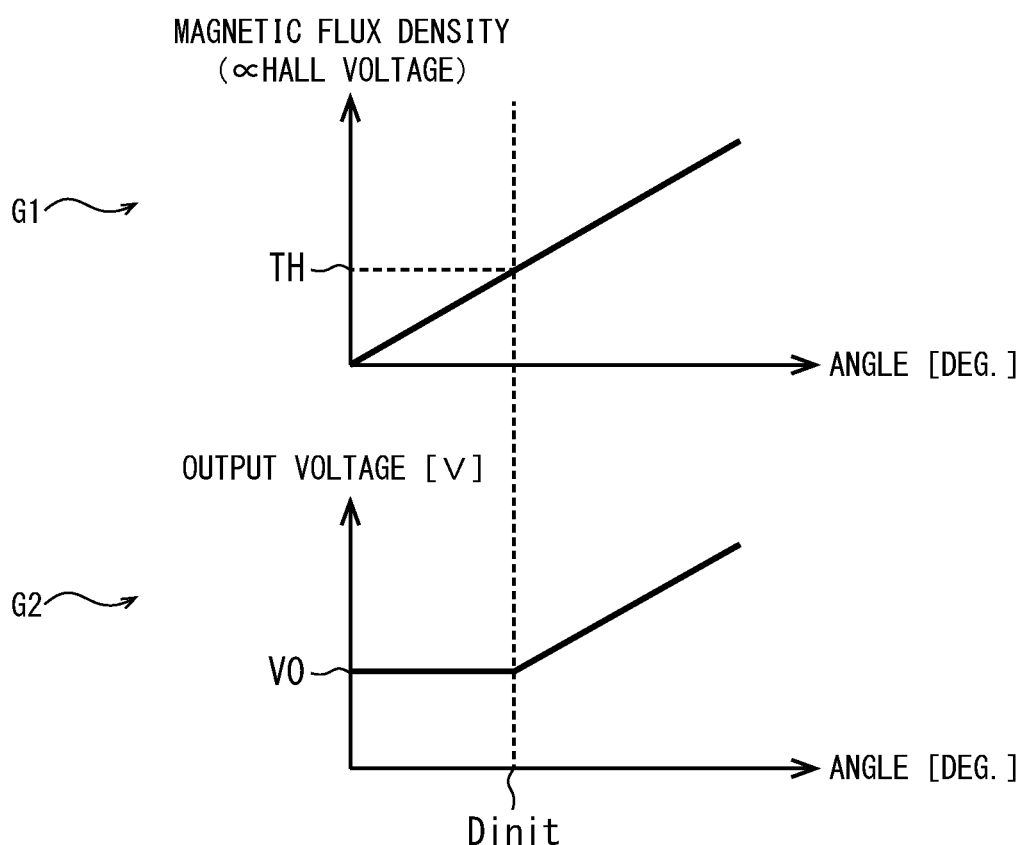
FIG. 7 is a schematic diagram for explaining the settable output voltage features in the first sensor and the second sensor.

FIG. 7 is a schematic diagram for explaining the settable output voltage features in the first sensor 81 and the second sensor 82. As shown in a first graph G1, magnetic flux density according to an angle of the handlebar grip 2 arises on Hall element of each sensor. That is, the three permanent magnets 60 in the Halbach array that are turned together with the handlebar grip 2 function as magnetism generation means and substantially linearly vary magnetic flux density on Hall element of each sensor according to a turning angle as shown in the first graph G1. Accordingly, Hall voltage that similarly substantially linearly varies because the Hall voltage is proportional to magnetic flux density is acquired on Hall element that functions as magnetism detection means.

As shown in a second graph G2 shown in FIG. 7, in the first sensor 81 and the second sensor 82 as the linear Hall IC, output voltage features according to an angle can be set. That is, by utilizing Hall voltage corresponding to a predetermined angle Dinit for the threshold TH for Hall voltage input on the Hall element that linearly varies as shown in the graph G1, as shown in the second graph G2, the output voltage features can be set so that predetermined voltage V0 is output at an angle at which Hall voltage is equal to or below a threshold TH and voltage that linearly increases from the predetermined voltage V0 is output as a turning angle increases than Dinit (by suitably performing amplification and others). The output voltage features can be set so that predetermined voltage V0 is evenly output in a range where it is determined with utilization of the threshold TH that the angle is equal to or below the angle Dinit.

Concretely, the output voltage features can be set by specifying the following three parameters. That is, the three parameters mean the angle Dinit [deg.] as a rise start angle at which voltage starts to rise, the voltage V0 [V] evenly output (output as a fixed value) as an initial value at the rising angle Dinit or below, and an inclination k [V/deg.] at which voltage linearly rises after rise. The parameters can be separately set between the first sensor 81 and the second sensor 82. The output voltage features are expressed by the following expressions having output voltage as V and an angle as D.

$$V=V0 \text{ (Case that angle } D \leq \text{Dinit)}$$

$$V=V0+k \times (\text{Dinit}) \text{ (Case that angle } D > \text{Dinit)}$$

Figure 8:
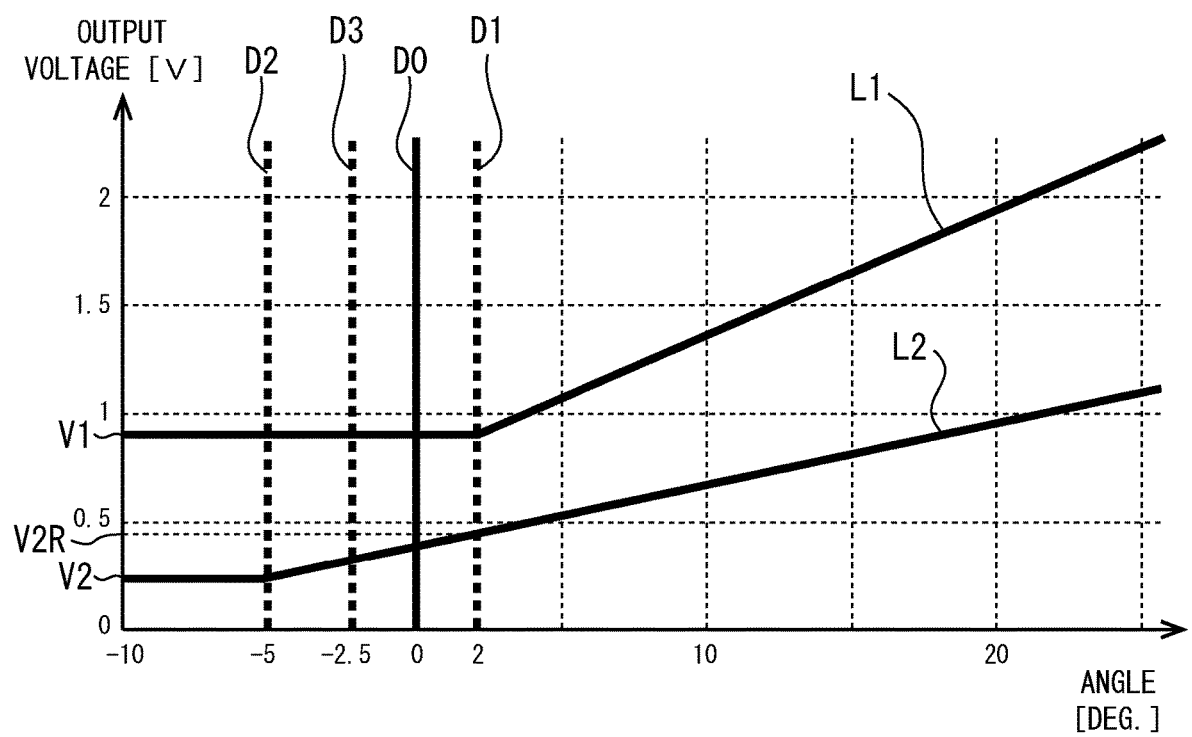
FIG. 8 shows a schematic example of the output voltage features of the first sensor and the second sensor in the one embodiment.

In the one embodiment, the output voltage features of the first sensor 81 and the second sensor 82 can be set so that the following first setting to fifth setting are met. FIG. 8 shows an example of the output voltage features of the first sensor 81 and the second sensor 82 in the one embodiment as respective graph lines L1, L2.

(First setting) As for output setting of the first sensor 81, an angle at which voltage starts to rise (a first rise start angle D1) is provided in a positive area. That is, the first rise start angle D1 is set as a predetermined position advanced in a positive direction from a predetermined angle D0 (a position of zero deg.) equivalent to the neutral position. In FIG. 8, a case that D1 is 2 deg. is shown as an example.

The predetermined angle D0 equivalent to the neutral position in FIG. 8 is set when the handlebar grip 2 is designed and is not displaced by abrasion and others, and the same applies hereinafter.

(Second setting) As for output setting of the second sensor 82, an angle at which voltage starts to rise (a second rise start angle D2) is provided to a negative area. That is, the second rise start angle D2 is set as a predetermined position advanced in a negative direction from the predetermined angle D0 equivalent to the neutral position. In FIG. 8, a case that D2 is −5 deg. is shown as an example.

The second rise start angle D2 may be also set as a maximum value (a limit value) in a reverse direction in which the handlebar grip 2 can be turned. As described above referring to FIG. 5, the limit value in the reverse direction is defined by the second stopper face 27 formed in the housing 20a and the second abutting part 51b that is provided to the abutting part 51 and abuts on the second stopper face 27.

(Third setting) An initial value (a first initial value V1) of output voltage of the first sensor 81 is set as a value larger than an initial value (a second initial value V2) of output voltage of the second sensor 82. In an example shown in FIG. 8, V1 is approximately 0.9 V, V2 is approximately 0.2 V, and relation that V1>V2 comes into existence.

(Fourth setting) An incline (a first incline k1) in the output feature (the graph line L1) of the first sensor 81 and an incline (a second incline k2) in the output feature (the graph line L2) of the second sensor 82 are differentiated. Especially, k1 shall be larger than k2. An example shown in FIG. 8 shows that in the graph lines L1, L2, the first incline k1 is larger than the second incline k2.

After output voltage rises in both sensors, a rate of first voltage output from the first sensor 81 and second voltage output from the second sensor 82 may be also set to be k1:k2. In an example shown in FIG. 8, k1:k2=2:1.

(Fifth setting) In all angle areas in which the handlebar grip 2 can be located, the first voltage and the second voltage are set to constantly have relation that the first voltage being output voltage of the first sensor 81 is higher than the second voltage being output voltage of the second sensor 82.

For example, a possible range of the angle D shall be "−5°≤D≤60°" and in an example shown in FIG. 8, the relation comes into existence. In the example shown in FIG. 8, angles exceeding a circumference of 25 deg. are not shown, however, as in the area exceeding 25 deg., the graph lines L1, L2 having difference between the inclines k1, k2 according to the fourth setting are extended as a straight line as they are, the relation comes into existence. When the graph lines have the relation, the first voltage and the second voltage never cross.

The ECU 90 is a computer that executes various control in the motorcycle and is provided with a detector 91 and a controller 92 as a functional part that performs functions related to the accelerator position detection device 100 according to the present invention.

The detector 91 detects "an angle for control" of the handlebar grip 2 on the basis of the first voltage output from the first sensor 81 and the second voltage output from the second sensor 82 respectively for which the above-mentioned output voltage features are set referring to FIG. 8. The controller 92 applies predetermined control processing to the motorcycle on the basis of the angle for control detected by the detector 91.

In this case, attention should be paid to the following conceptual difference related to "the angle". That is, the detector 91 "detects" "the angle for control" of the handlebar grip 2 on the basis of the output voltage features shown in FIG. 8, however, there is difference that an angle in the output voltage features shown in FIG. 8 is "an actual angle in design of the handlebar grip 2 where no displacement and others are caused" and in the meantime, an angle detected by the detector 91 is "an angle for control acquired in a range where no trouble occurs in operation using the handlebar grip 2 by the occupant even if displacement is actually caused, estimating that displacement and others may be caused after design".

Details of the detector 91 and the controller 92 will be described in a first case and a second case below.

(First case) When the first voltage output from the first sensor 81 is higher than the first initial value V1, the detector 91 detects an angle for control as an angle determined on the basis of the first voltage. For example, an angle for control may be detected on the basis of the graph line L1 (the voltage output feature of the first sensor 81) shown in FIG. 8 as a positive angle determined as a value acquired by subtracting the first initial value V1 from the first voltage. That is, when the angle for control is D [for control], it may be detected as shown in the following expression (1). "k1" means an incline of the graph line L1 after it rises at the first rise start angle D1 as described above.

$$D[\text{for control}] = (\text{first voltage} - V1)/k1 \qquad (1)$$

The controller 92 may perform first control according to the first case when detection of an angle according to the first case is made. For example, angle control of a throttle valve of the motorcycle may be also made according to an angle for control detected as the positive value. Consequently, the similar angle control of the throttle valve to angle control made in the existing handlebar grip in which the handlebar grip can be turned only in an either direction from a fully closed position (0°) can be realized in the handlebar grip 2 turnable in both directions according to the present invention as the first case.

(Second case) When the first voltage output from the first sensor 81 is equal to the first initial value V1, the detector 91 detects an angle for control as a negative angle determined on the basis of the second voltage. For example, an angle for control (D [for control]) may be also detected as shown in the following expression (2) as a negative angle determined as a value acquired by subtracting a reference value V2R from the second voltage on the basis of the graph line L2 (the voltage output feature of the second sensor 82) shown in FIG. 8.

$$D[\text{for control}] = (\text{second voltage} - V2R)/k2 \qquad (2)$$

In this case, the reference value V2R is a value on the graph line L2 at the first rise start angle D1 shown in FIG. 8, that is, the second voltage. "k2" is an inclination after the graph line L2 rises at the initial value V2 as described above.

The controller 92 may perform second control according to the second case when angle detection according to the second case is made. For example, predetermined second control may be also performed over the motorcycle using that a temporal change of an angle for control detected as a negative value shows predetermined behavior (a concrete example of the behavior will be described later) for a trigger. For a standpoint of the occupant, the second control separate from the first control in the first case can be made performed over the motorcycle by operating the handlebar grip 2 so that the temporal change of the angle for control detected as the negative value shows the predetermined behavior. That is, according to the accelerator position detection device 100 of the present invention, as the second control different from the first control in turning in a forward direction is enabled when the handlebar grip 2 is turned to the reverse direction from the neutral position, a new function can be added to the handlebar grip 2 in the present invention, compared with the existing handlebar grip turned only in the forward direction.

Concretely, the predetermined behavior of the temporal change of the angle for control detected as the negative value used for the trigger has only to be set as such behavior that the angle for control in the negative area crosses a negative predetermined angle D3 in a direction in which the angle rises (the direction toward 0°) for example. Besides, concretely, the second control executed by the controller 92 using that the behavior occurs for a trigger may function as a release of auto-cruise control in the motorcycle for example. The auto-cruise control of the motorcycle has only to be started by pressing a separate button not shown in FIG. 1 in the handlebar switch 4.

The above-mentioned negative predetermined angle D3 is shown as −2.5° in the example shown in FIG. 8 in representation as an actual angle, however, D3 as an angle for control is calculated as −4.5° as follows.

Negative predetermined angle D3 as angle for control=−2.5°−2°=−4.5°

That is, as described above, FIG. 8 has "actual angles in design" as the x-axis, in the example shown in FIG. 8, an origin (the position of 0°) of "the actual angles in design" is the angle D0, and in the meantime, an origin (a position of 0° for differentiating the first case and the second case) of "the angle for control" is located at 2° as the first rise start angle D1 when the origin is represented as an actual angle in FIG. 8. Accordingly, as respective origin positions of "the actual angle" and "the angle for control" are differentiated by difference between D0 and D1, D3 is calculated as described above.

Further, as clear from the description, when a scale of the x-axis shown in FIG. 8 is parallelly shifted so that a position of the first rise start angle D1 is equivalent to 0°, the graph shown in FIG. 8 is represented by "the angle for control".

It will be described using first to third examples below that even if the neutral position is displaced because of abrasion and others after long-term use of the handlebar grip 2, the position of 0° as the angle for control can be readily detected by the detector 91 and the controller 92 respectively configured as described above and operation using the handlebar grip 2 by the occupant is also enabled without a problem.

First Example

Case that Neutral Position is Never Displaced as it is in Design

In this case, the neutral position is located at 0° as an actual angle and at −2° as an angle for control. In a case that the occupant turns the handlebar grip 2 in a forward direction, 0° as an angle for control is detected at once because an initial value of the first voltage rises when an actual angle becomes 2° and the angle for control becomes 0°, the first control is started, and angle control of the throttle valve for example is enabled. There is play for 2° until the first control is started from the neutral position, however, as the play is a small value, the play does not come into question for the occupant's operation.

Besides, when the occupant performs operation for returning the handlebar grip to the neutral position after he/she turns the handlebar grip 2 in the reverse direction, the second control is not executed until the occupant returns the handlebar grip after he/she turns the handlebar grip 2 up to a position exceeding a position at −2.5° as an actual angle and a position at −4.5° as an angle for control (in an absolute value). Accordingly, to make the second control executed, a larger turn (in the reverse direction) than −2.5° from the neutral position has only to be made.

Second Example

When displacement in the reverse direction that the neutral position is located at −1° as an actual angle is caused, the neutral position is located at −1° as the actual angle and at −3° as an angle for control. When the occupant turns the handlebar grip 2 in a forward direction, 0 deg. as an angle for control is detected at once because an initial value of the first voltage rises at 2° as an actual angle and at 0° as the angle for control, the first control is started, and angle control over the throttle valve for example is enabled. There is play for 3° until the first control is started from the neutral position, however, as the play is a small value, the play does not come into question for the occupant's operation.

Besides, when the occupant returns the handlebar grip to the neutral position after he/she turns the handlebar grip 2 in the reverse direction, the second control is not executed until the occupant returns the handlebar grip after he/she turns the handlebar grip 2 up to a position exceeding a position of −2.5° as an actual angle and a position of −4.5° as an angle for control (in an absolute value). Accordingly, to make the second control executed, a larger turn than −1.5° (in the reverse direction) from the neutral position has only be made. In this case, even if the neutral position is displaced in a position in the reverse direction equivalent to −1° as an actual angle, the second control is never arbitrarily executed at the displaced neutral position against the occupant's intention.

Third Example

When displacement in the positive direction that the neutral position is located at 1° as an actual angle is caused, the neutral position is located at 1° as the actual angle and at −1° as an angle for control. When the occupant turns the handlebar grip 2 in a forward direction, 0 deg. as an angle for control is detected at once because an initial value of the first voltage rises at 2° as an actual angle and at 0° as the angle for control, the first control is started, and angle control over the throttle valve for example is enabled. There is play for 1° until the first control is started from the neutral position, however, as the play is a small value, the play does not come into question for the occupant's operation. In this case, even if the neutral position is displaced in the positive direction by 1° as an actual angle, the first control is never started against the occupant's intention in the displaced neutral position.

Besides, when the occupant returns the handlebar grip to the neutral position after he/she turns the handlebar grip 2 in the reverse direction, the second control is not executed until the occupant returns the handlebar grip after he/she turns the handlebar grip 2 up to a position exceeding a position at −2.5° as an actual angle and a position at −4.5° as an angle for control (in an absolute value). Accordingly, to make the second control executed, a larger turn (in the reverse direction) than −3.5° from the neutral position has only to be made.

As clear from the above-mentioned first to third examples, the accelerator position detection device according to the present invention 100 can produce the following effects. That is, even if a certain extent of displacement is caused in a forward or the reverse direction on the basis of the neutral position, a position of 0° as the angle for control can be readily detected, the first control and the second control can be executed by operating the handlebar grip 2 as the occupant intends, and accordingly, the first and second control is prevented from being executed against occupant's intention.

Though the following is also clear from the above description, generally, displacement in the positive direction is allowed by difference between the angle D0 and the first rise start angle D1 and if the displacement in the positive direction is in the range, the first control is prevented from being executed in the neutral position by mistake. Besides, displacement in the reverse direction is allowed by difference between the angle D0 and the angle D3 and if the displacement in the reverse direction is in the range, the second control is prevented from being executed in the neutral position by mistake.

Supplementary items for explanation in the present invention will be described below.

(1) When such first voltage and second voltage that the above-mentioned fifth setting is not met are acquired, that is, when first voltage that is lower than second voltage and is not matched with the graph shown in FIG. 8 is acquired, the detector 91 may also judge that failure occurs in at least either of the first sensor 81 or the second sensor 82. According to the fifth setting, failure detection is enabled in the whole angle area.

(2) The first sensor 81 and the second sensor 82 may be arranged in positions in which the same magnetic flux density is mutually acquired, that is, in positions corresponding to the same angle. When the first sensor 81 and the second sensor 82 are arranged spatially apart by a fixed amount or more and acquired angles are discrepant, the first sensor 81 and/or the second sensor 82 may be set so that difference between the acquired angles is compensated and the output voltage features shown in FIG. 8 are acquired.

(3) It is described above that the output voltage features shown in FIG. 8 have positive values as values of voltage, however, the present invention can be also similarly applied to a case that voltage is output as a negative value and the similar relation to the relation shown in FIG. 8 is acquired in an absolute value. That is, the voltage in the output voltage features shown in FIG. 8 may be also equivalent to its volume (in an absolute value). Besides, for a variation of the present invention, output voltage features that meet only an arbitrary part of the above-mentioned first to fifth settings may be also used. To realize separate control in turning operation in the forward direction and in the reverse direction of the handlebar grip 2, it is desirable that at least the first setting and the second setting are utilized.

(4) The first case and the second case are separately described above for convenience, however, as clear from the expressions (1), (2), the angle for control D [for control] is zero at a boundary point (the angle D1 shown in FIG. 8) between the first case and the second case and when a case that the handlebar grip 2 is continuously operated from the reverse rotation position (however, a position in which a value is larger than D2 in the positive direction) to the normal rotation position is considered, the continuously increasing angle D [for control] across the second case and the first case is detected.

REFERENCE SIGNS LIST

100 Accelerator position detection device
2 Handlebar grip
81 First sensor
82 Second sensor
91 Detector
92 Controller
D1 First rise start angle
D2 Second rise start angle
V1 First initial value
V2 Second initial value

The invention claimed is:

1. An accelerator position detection device comprising:
a handlebar grip that is turnable in a normal rotation direction and in a reverse rotation direction from a neutral position and that is energized to the neutral position when no operation is applied;
accelerator position sensors that output voltage according to an angle of the handlebar grip and that include a first sensor and a second sensor; and
a detector that detects an angle for control for controlling a vehicle on the basis of the angle of the handlebar grip according to output from the accelerator position sensors,
wherein the first sensor outputs a first voltage rising in volume from a position exceeding a first rise start angle located in a normal rotation direction by a predetermined quantity from the neutral position in the normal rotation direction,
wherein the second sensor outputs a second voltage rising in volume from a position exceeding a second rise start angle located in a reverse rotation direction from the neutral position by a predetermined quantity in the normal rotation direction,
wherein the detector detects an angle for control as a positive value on the basis of the first voltage when the first voltage in a rising range is output, and
wherein the detector detects an angle for control as a negative value on the basis of the second voltage when a first initial value not located in the rising range is output.

2. The accelerator position detection device according to claim 1, wherein the first sensor and the second sensor are configured in such a manner that a first incline on which the first voltage rises and a second incline on which the second voltage rises are different.

3. The accelerator position detection device according to claim 2, wherein the first sensor and the second sensor are configured to make the first incline on which the first voltage rises larger than the second incline on which the second voltage rises and to make a first initial value when the first voltage starts to rise larger than a second initial value when the second voltage starts to rise.

4. The accelerator position detection device according to claim 3, wherein the first sensor and the second sensor are configured to constantly make the first voltage higher than the second voltage in a range in which the handlebar grip is turned.

5. The accelerator position detection device according to claim 4, wherein a judgment that a failure occurs in the first sensor and/or the second sensor is made when the first voltage is not higher than the second voltage in output.

6. The accelerator position detection device according to claim 1,
    wherein the detector detects an angle for control as the positive value as a value according to a rising amount of the first voltage when the first voltage in the rising range is output, and
    wherein the accelerator position detection device further includes a controller that executes a first control according to the angle for control as the positive value.

7. The accelerator position detection device according to claim 6,
    wherein the detector detects an angle for control continuously increasing according to an increase of the first voltage and the second voltage as the positive value and the negative value by detecting an angle for control when the first voltage starts to rise as zero,
    wherein the accelerator position detection device further includes a controller that executes a second control according to the angle for control as the negative value, and
    wherein the controller executes the second control using that an angle for control as the negative value increases in the normal rotation direction and exceeds a negative predetermined threshold for a trigger.

8. The accelerator position detection device according to claim 1,
    wherein the detector detects an angle for control continuously increasing according to an increase of the first voltage and the second voltage as the positive value and the negative value by detecting an angle for control when the first voltage starts to rise as zero,
    wherein the accelerator position detection device further includes a controller that executes a second control according to the angle for control as the negative value, and
    wherein the controller executes the second control using that an angle for control as the negative value increases in the normal rotation direction and exceeds a negative predetermined threshold for a trigger.

9. The accelerator position detection device according to claim 8, wherein the second control means a release of auto-cruise control in a vehicle.

* * * * *